United States Patent [19]

Vanderspool, II et al.

[11] Patent Number: 5,398,263
[45] Date of Patent: Mar. 14, 1995

[54] AUTONOMOUS PULSE TRAIN TIMING CONTROLS FOR TIME-MARK ALIGNMENT

[75] Inventors: Jan P. Vanderspool, II, Woodstock; Mark G. Spiotta, Wheaton, both of Ill.

[73] Assignee: Motorola, Inc., Schaumburg, Ill.

[21] Appl. No.: 4,407

[22] Filed: Jan. 14, 1993

[51] Int. Cl.$^6$ .............................................. H04B 7/00
[52] U.S. Cl. .................................. 375/376; 455/51.2; 455/180.3; 327/159
[58] Field of Search ..................... 375/120; 328/55, 63, 328/72, 133, 134, 155; 455/51.2, 51.1, 67.6, 180.3, 54.1, 56.1

[56] References Cited

U.S. PATENT DOCUMENTS

| | | | |
|---|---|---|---|
| 3,983,498 | 9/1976 | Malek . | |
| 4,188,582 | 2/1980 | Cannalte et al. | 455/51.2 |
| 4,696,051 | 9/1987 | Breeden et al. | 455/51.2 |
| 5,052,031 | 9/1991 | Molloy | 375/120 |
| 5,121,417 | 6/1992 | Swierczek | 375/120 |
| 5,289,508 | 2/1994 | Wada et al. | 375/120 |

Primary Examiner—Stephen Chin
Assistant Examiner—Timothy J. May
Attorney, Agent, or Firm—R. Louis Breeden

[57] ABSTRACT

A phase lock loop (700) maintains a freewheeling capability while making phase corrections to a sample clock signal based on a precision timing signal. The phase corrections are dispersed over time such that data reception in uninterrupted so that data integrity is maintained during the phase corrections. The phase lock loop (700) includes a first divider circuit (721) having a divisor n, coupled for dividing the incoming clock signal by n to produce a bit clock signal. A second divider circuit (725) is coupled to the bit clock signal for dividing the bit clock signal to produce the sample clock signal. A phase comparator (717) is coupled to a 1PPS signal that provides a time-mark to said phase lock loop (700) for calibration, wherein the phase comparator (717) measures a number of input clock signal cycles from a predetermined edge of the 1PPS signal to a predetermined edge of the sample clock signal and provides a correction signal indicative of a number of input clock signal cycles and a phase direction error between the sample clock signal and the 1PPS signal for modifying a value of the divisor n for correcting the measured phase error simultaneously with data reception.

21 Claims, 8 Drawing Sheets

FIG. 1  PRIOR ART

PRIOR ART

AUTONOMOUS PULSE TRAIN TIMING CONTROLS FOR TIME-MARK ALIGNMENT

FIELD OF THE INVENTION

This invention relates in general to the field of timing functions in communication equipment, and more particularly, to a digital phase lock loop having autonomous pulse train lining controls.

BACKGROUND OF THE INVENTION

Simulcast transmission is useful for increasing the coverage area in land-mobile radio systems as is well known to those skilled in the art. Simulcast transmission incorporates at least two transmitters simultaneously broadcasting identical information on the same frequency and being located to provide contiguous coverage over an area larger than would be possible for a single transmitter broadcasting alone. Precise time control of base band signals is required in simulcast transmission. For example, if base band signals are transmitted at incorrect times by the two transmitters, distortion occurs where signals are received from both transmitters with similar signal strengths. Such distortion is present when the various signals arrive at the receiving end with even slight phase or timing differences with respect to each other.

Figure 1:
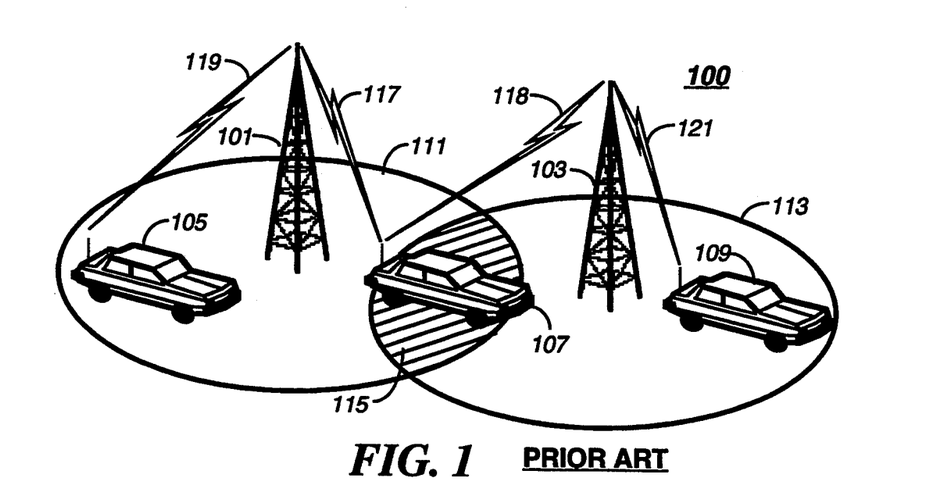
FIG. 1 is a graphical representation of a simplified simulcast transmission system as is known in the art.

FIG. 1 shows a simplified simulcast transmission system 100 including two base stations or remote site transmitters 101 and 103. Remote site transmitter 101 provides coverage for an area 111, and subscriber units 105 and 107 receive transmitted messages 119 and 117, respectively, therein. Similarly, remote site transmitter 103 provides coverage for an area 113, and subscriber units 107 and 109 receive transmitted messages 118 and 121, respectively, therein. Coverage areas 111 and 113 overlap by coverage area 115, within which the subscriber unit 107 receives transmissions from both transmitters 101 and 103. Hence, the transmissions 117 and 118 are perceived as a single signal by the subscriber unit 107.

Figure 2:
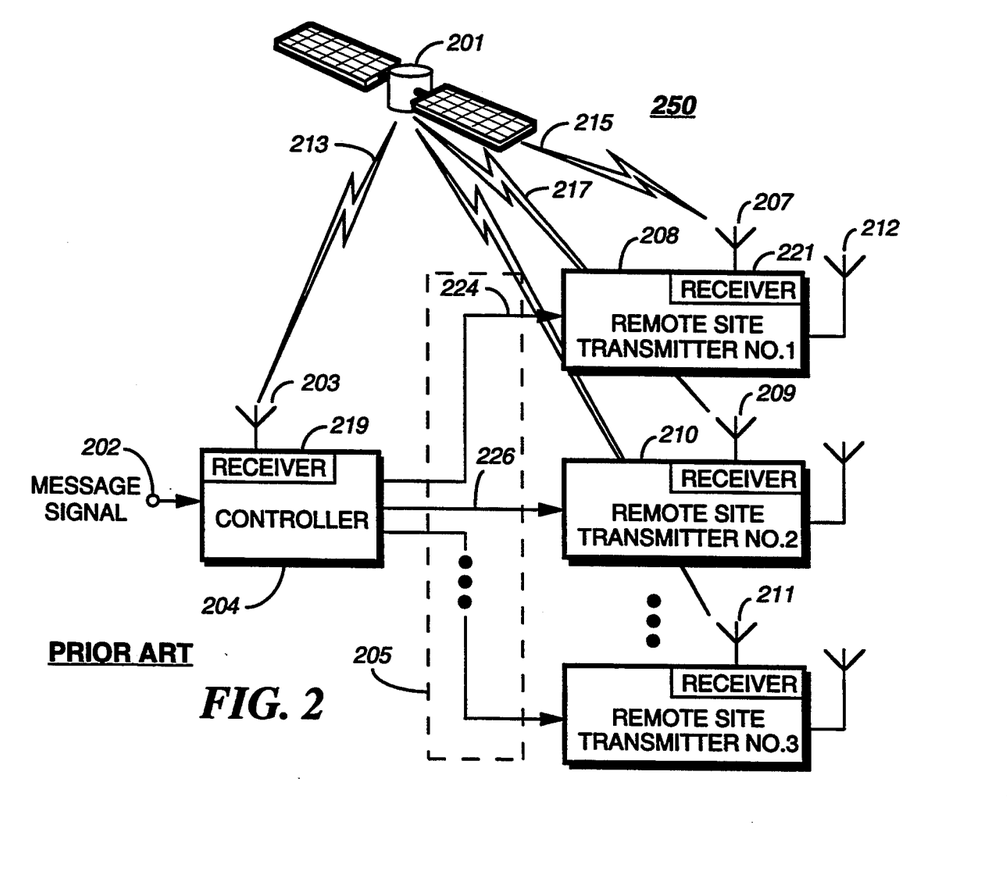
FIG. 2 is a simplified block diagram of a simulcast transmission system employing a Global Positioning System (GPS) timing reference signal scheme.

FIG. 2 depicts a new simulcast radio system 250 which is more fully described in patent application, "Simulcast Transmission System Having Predetermined Launch Times", filed Jan. 28, 1991, Ser. No. 646,577, and assigned to the assignee of the present Application, which is hereby incorporated by reference.

In the past, a typical transmission sequence began by sending a message signal 202 to a controller 204 for transmission to one or more coverage areas. The controller 204 distributes the message signal 202 to one or more remote site transmitters (e.g., 208, 210, etc.). Distribution was accomplished via an expensive microwave distribution system made up of a plurality of interconnect links (not shown). Each remote site transmitter 208, 210, etc., would transmit the message signal 202 upon receipt to a subscriber unit within the appropriate coverage area. The critical timing requirements necessitated the use of precisely calibrated or netted interconnect links (i.e., the total propagation delays are made identical across all interconnect links).

Simulcast transmission is improved by the transmission system 250 shown in FIG. 2. Here, the message signal 202 is received by the controller 204, as before, and further processed (e.g., converted to digital form) before sending the message signal 202 to the respective remote site transmitters 208, 210 via interconnect links 224, 226, respectively. Now, however, a precision timing reference signal receiver 219, 221, is provided in the controller 204 and in the remote site transmitter 208, respectively, for establishing the proper critical timing. An earth-orbiting vessel 201 transmits precision timing reference signals to each respective antenna 203, 207, 209 and 211 for establishing absolute timing for the controller 204 and each remote site transmitter 208, 210, etc. The controller 204 then calculates a "launch" time which is a predetermined, exact future time in which the message signal 202 (now buffered) is to be sent to a transmitting end of remote site transmitter 208, 210. The launch time takes into account a predetermined propagation delay of the interconnect links 224, 226. The launch time is next combined with the message signal 202 (message bundle) and sent to the remote site transmitters 208, 210 via the interconnect links 224, 226 of a distribution network 205.

Antenna 207 in combination with the receiver 221 receives a timing reference signal 215 which the remote site transmitter 208 uses as an exact, or absolute, timing reference. When the message bundle is received by the remote site transmitter 208 the launch time is removed therefrom and compared to the current absolute time provided by the timing reference signal 215. When these times are identical the remote site transmitter 208 (and 210, etc.) re-transmits via an antenna 212 the message signal 202 to the appropriate coverage area such that transmission times amongst the several remote site transmitters are substantially identical. The timing signals 213, 215, and 217 are typically phase-synchronized to within 100 nanoseconds. However, the phase difference between Phase-Locked-Loops (PLLs) resident at the several remote site transmitters may add additional phase differences resulting in further undesirable timing differences.

Figure 3:
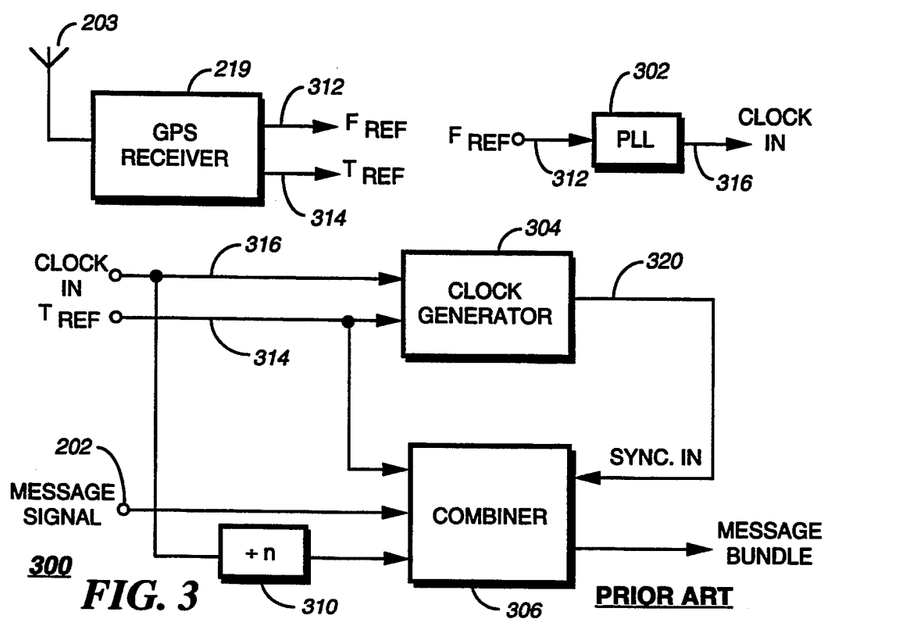
FIG. 3 is a simplified block diagram of a system controller portion of a simulcast transmission system.
Figure 4:
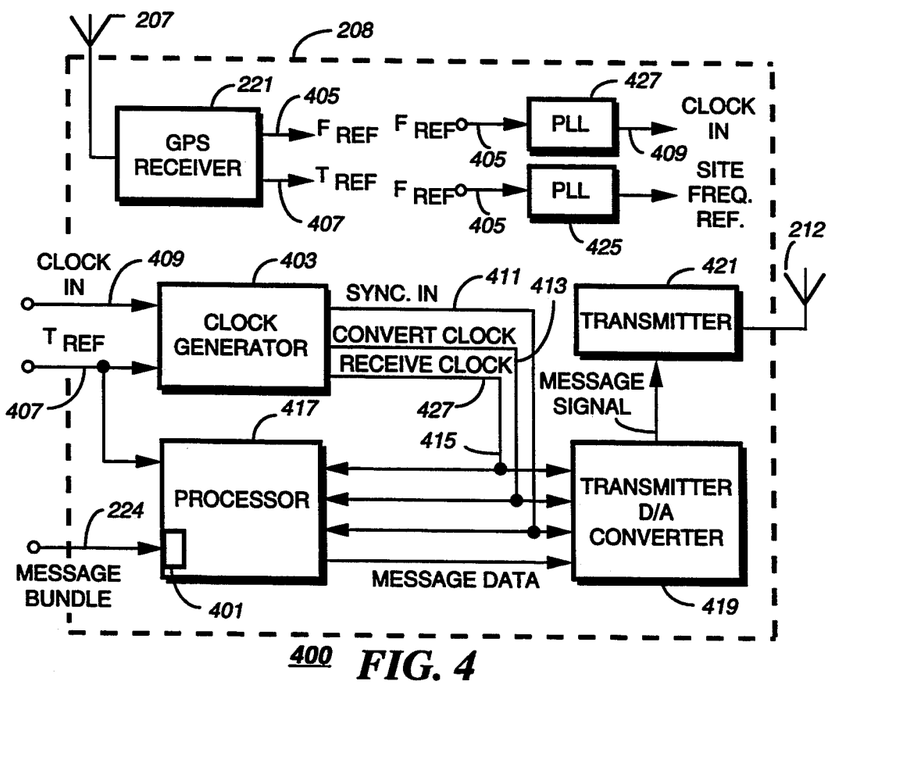
FIG. 4 is a simplified block diagram of a remote site transmitter portion of a simulcast transmission system.

The phase difference considerations between the several remote site transmitters can be better appreciated by reference to FIGS. 3 and 4. FIG. 3 provides a more detailed block diagram of the controller 204 wherein a frequency reference signal 312 and a timing reference signal 314, are generated by the Global Positioning System (GPS) receiver 219 in response to the timing reference signal 213. The frequency reference signal 312 is input into a Phase Lock Loop (PLL) circuit 302 for generating a clock in signal 316 which is further input into a clock generator circuit 304 along with the timing reference signal 314 for updating an absolute time clock therein and synchronizing clocks within the several remote site transmitters. Clock generator 304 also sends a master synchronization input signal 320 to a combiner 306, which is used along with the timing reference signal 314 to produce a time stamp for combining with the message signal 202. Clock in signal 316 is divided by a divide-by-n circuit 310 which is input into the combiner 306 to establish a data rate at which the message bundle is transferred onto the distribution network 205. A 9.6 Khertz data rate could be established, for example, by switching the clock in signal 316 at 3.072 Mhertz and using a divide-by-n circuit wherein n is equal to 320.

FIG. 4 is a block diagram representation of the remote site transmitter 208 having a GPS receiver 221 for receiving the timing reference signal 215 (FIG. 2) via the antenna 207 for generating a frequency reference signal 405 and a timing reference signal 407. The frequency reference signal 405 is input into a PLL 425 for generating a site frequency reference signal, switching, for example, at 16.8 Mhertz, for the remote site transmitter 208. By action of a PLL 427, the frequency reference signal 405 is also used for generating a clock in signal 409. A clock generator 403 receives the clock in signal 409 to produce a master sync. in signal 411, a convert clock signal 413, and a receive clock signal 415 which signals are used to provide synchronizing and clock data to signal processing hardware including a processor 417 and D/A (digital to analog) converter 419.

The message bundle 224 is received by the remote site transmitter 208 at the processor 417, wherein the message bundle 224 is separated into the digital message data representing the message signal, and into launch time data. The digital message data is then placed into a data buffer 401 and held until the current time of day, provided by manipulation of the timing reference signal 407, matches exactly with the launch time provided in the message bundle. When this condition exists, the message data is passed to the D/A converter 419 to reconstruct the original message signal. The reconstructed message signal is then sent, via a transmitter 421, to the coverage area defined by the location of the remote site transmitter 208.

The accuracy in the time-of-arrival of the time-mark is not perfect. Some time-mark receivers average their time-mark solutions against their own internal clock. Time-mark receivers which output their time-solution directly without any time averaging or other time buffering present time-marks having the greatest amount of inaccuracies. The time-mark output from a time-mark receiver usually has a characteristic jitter due to the finest increment of time resolution, typically 100 nanoseconds. The time-mark solution will also typically have a time bias unique to the particular time sources which the receiver is solving from at a particular time (for GPS, this would be the particular choice of satellites). As the time-sources are handed off or changed, the unique time bias will likely change. This can appear as a step change in the timing from the time-mark receiver.

Additionally, the time solution will be subject to carrier signal-to-noise limitations and could temporarily jump to a substantial offset from Universal Coordinated Time (UTC) for one or several time solution periods. With signal-to-noise recovery or a change to an alternate time-source (for example, an alternate satellite), the timing solution could come back to the more typical offset. The transmitter, desirably, should operate off of the non-averaged time-mark solutions, which typically may have an uncertainty in timing of plus/minus one microsecond with occasional random larger errors. In a case of a GPS time-mark receiver failure, the time-mark may be output repetitively at a substantial offset from the correctly aligned time position.

Thus, what is needed is a simulcast transmission system with a remote site transmitter having a free wheeling capability and being responsive to commands for advancing or retarding transmitter timing via a digital phase locked loop without loss or corruption of modulation data.

SUMMARY OF THE INVENTION

An aspect of the present invention is a phase lock loop for making phase corrections on a sample clock signal based on a precision timing signal, the phase corrections being dispersed over time. The phase lock loop comprises a first divider circuit having a divisor n, coupled to the precision timing signal for dividing the precision timing signal by n to produce a bit clock signal. The divisor n can be selectively incremented or decremented to divide the precision timing signal by n, by n+1, or by n−1. The phase lock loop further comprises a second divider circuit coupled to the bit clock signal for dividing the bit clock signal to produce the sample clock signal, and a phase comparator coupled to a time-mark signal and coupled to the sample clock signal for comparing the time-mark signal and the sample clock signal to generate a correction signal indicating a direction of a phase error. The correction signal has a duration proportional to a number of cycles of the precision timing signal from a predetermined edge of the time-mark signal to a predetermined edge of the sample clock signal for further indicating a magnitude of the phase error between the sample clock signal and the time-mark signal. The correction signal is utilized by a mode control circuit for determining a divide control signal for selectively incrementing or decrementing the divisor n for correcting the phase error. The phase lock loop further comprises the mode control circuit coupled to the time-mark signal and coupled to the phase comparator for receiving the correction signal, and further coupled to the first divider circuit for receiving the bit clock signal and for sending to the first divider circuit the divide control signal.

Another aspect of the present invention is a digital phase lock loop for making both coarse and fine resolution phase corrections between an incoming clock signal and a sample clock signal, the phase corrections being dispersed over time. The digital phase lock loop comprises a programmable divider circuit having a divisor n that is selectively incrementable or decrementable, coupled to the incoming clock signal for dividing the incoming clock signal and generating a bit clock signal therefrom. The digital phase lock loop further comprises a divider circuit coupled to the bit clock signal for dividing the bit clock signal and generating the sample clock signal therefrom, and a phase comparator coupled to the incoming clock signal, the bit clock signal, and the sample clock signal, for measuring a number of the incoming clock signal cycles from a predetermined edge of a time-mark signal when a valid time-mark signal is received, to a predetermined edge of the sample clock signal and for providing a correction signal indicative of a direction and magnitude of a phase error between the sample clock signal and the time-mark signal. The correction signal has a duration proportional to the number of incoming clock signal cycles measured. The digital phase lock loop further comprises a mode control circuit coupled to a time-mark validated windowing circuit for receiving the valid time-mark signal. The mode control circuit is also coupled to the phase comparator for receiving the correction signal and is coupled to the programmable divider circuit for receiving the bit clock signal for generating a divide control signal therefrom to control the programmable divider circuit for incrementing or decrementing the divisor n according to the correction signal when the valid time-mark signal is received. In addition, the digital phase lock loop includes the time-mark validated windowing circuit coupled to a programmable delay circuit for receiving therefrom a delayed time-mark signal for determining whether the time-mark signal has been received by the time-mark validated windowing circuit within a predetermined time window, and for generating the valid time-mark signal when the time-mark signal has been received within the predetermined time window, and further coupled to the mode control circuit and to the phase comparator for sending the valid time-mark signal thereto. The digital phase lock loop also includes the programmable delay circuit coupled to the time-mark signal and to a delay set signal for receiving the time-mark signal and the delay set signal for fine tuning the time-mark signal, the programmable delay circuit providing the delayed time-mark signal therefrom.

Another aspect of the present invention is a remote site transmitter for use in a simulcast transmission system. The remote site transmitter receives a message bundle from a central controller via an interconnect link. The message bundle includes a digital message portion and a launch time. The remote site transmitter converts the digital message portion into an analog message and retransmits the analog message to a given geographical area at a time determined, at least in part, by the launch time. The remote site transmitter comprises a processor for separating the message bundle into the digital message portion and the launch time, the processor including a phase comparator. The remote site transmitter further comprises a receiver for receiving a timing reference signal and generating therefrom a time-mark signal for delivery to the processor, and a digital to analog converter coupled to the processor for receiving the digital message portion and reconstructing the analog message. The remote site transmitter also includes a transmitter coupled to the digital to analog converter for receiving the analog message and retransmitting the analog message to the given geographical area, and a clock generator coupled to the phase comparator for making phase corrections on a sample clock signal based on a precision timing signal, the phase corrections being dispersed over time. The clock generator comprises a first divider circuit having a divisor n, coupled to the precision timing signal for dividing the precision timing signal by n to produce a bit clock signal, and coupled to the digital to analog converter and to the processor for providing the bit clock signal thereto. The clock generator further comprises a second divider circuit coupled to the bit clock signal for dividing the bit clock signal to produce the sample clock signal, and coupled to the digital to analog converter and to the processor for providing the sample clock signal thereto. The remote site transmitter further comprises the phase comparator coupled to the time-mark signal and coupled to the sample clock signal for comparing the time-mark signal and the sample clock signal to generate a correction signal indicating a direction of a phase error. The correction signal has a duration proportional to a number of cycles of the precision timing signal from a predetermined edge of the time-mark signal to a predetermined edge of the sample clock signal for further indicating a magnitude of the phase error between the sample clock signal and the time-mark signal. The correction signal is utilized for determining a divide control signal for selectively incrementing or decrementing the divisor n for correcting the phase error simultaneously with the processing of the message bundle.

DESCRIPTION OF A PREFERRED EMBODIMENT

Referring to FIG. 4, the clock signals used to drive the D/A converter 419 must be precise. Similar signals at each remote site transmitter, all synchronized together, permit synchronized modulation for effective simulcast transmission. Repetitive pulse alignment is required since a timing reference oscillator at each remote site transmitter is not precisely on frequency. Given a timing reference oscillator accuracy of one part in $10^{11}$ and a maximum allowable timing error of one microsecond, realignment for synchronization would be required about once every million seconds. This is typical for trunking systems. For convenience, a repetitive time-mark occurring once every second is provided, but actual realignment of the timing occurs at a much slower rate. Given a timing reference oscillator accuracy of one part in $10^9$ realignment would be required about once every 16.6 minutes. This is typical for less stringent simulcasting systems, for example, in digital paging. The necessary realignment rate is still much slower than the time-mark repetition rate. This demonstrates that for readily achievable timing reference oscillator accuracies, a remote site transmitter may have the capability to "free wheel" and preserve required system timing accuracy for periods significantly longer than the repetition rate of the time-mark.

Figure 5:
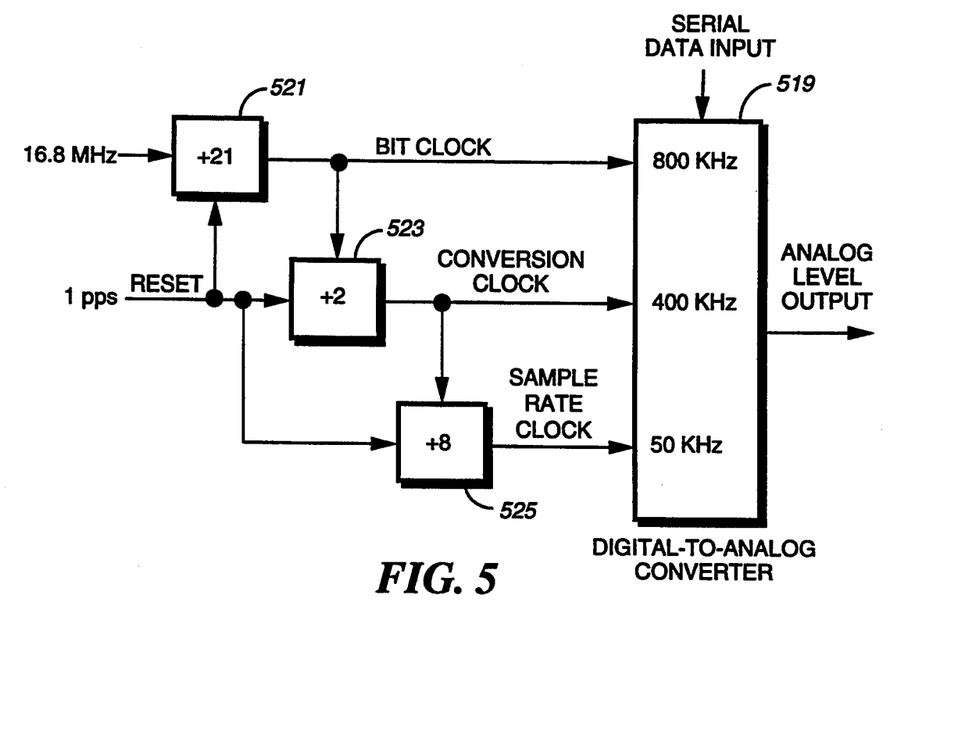
FIG. 5 is a block diagram of a digital to analog (D/A) converter requiring several clock frequencies.

FIG. 5 depicts a Digital to Analog (D/A) converter 519 requiring several clock frequencies for operation. The several clock frequencies are derived by dividing down a higher clock frequency. The highest rate clock, for example, 16.8 Mhertz, is input into a divider 521 to produce a bit clock which is used to serially clock the bit information, presented at a serial data input, into the D/A converter 519 for each output sample. Sixteen bits per sample is typical. A conversion clock (at an intermediate frequency), derived by further dividing the bit clock by two by a divider 523, is used internally by the D/A converter 519 for generating the analog output level. Those skilled in the art will appreciate that not all D/A converters make use of an intermediate clock. A sample rate clock, derived by dividing the conversion clock by eight by a divider 525, determines the rate at which the serial data input is converted to an analog level. Time alignment of the sample rate clock results in time alignment of the analog output level. Resetting the dividers 521, 523, and 525 by a time-mark pulse, i.e., a one pulse-per-second (1PPS) signal, could be used to ensure that the sample rate clock is aligned to the time-mark.

Given a 16.8 Mhertz input clock rate, the bit clock period is approximately 1.25 microseconds. A pulse-to-pulse timing variation of up to 1 microsecond is possible in the 1PPS signal. One pulse might lead Universal Coordinated Time (UTC) by one microsecond, with the following pulse lagging UTC by one microsecond. Successive resetting of the dividers 521, 523, and 525 by such time-marks would cause a loss of one of the cycles of the bit clock, thereby corrupting the output level conversion process. But, since the transmitter clock has a freewheeling capability, it is not necessary to instantaneously time-align the transmitter at the instant of the time mark arrival. An effective solution involves "walking" the transmitter timing in the direction which tends to align the timing. This means that the transmitter timing would be advanced or retarded in a fashion like spinning the hands on a clock either faster or slower.

Figure 6:
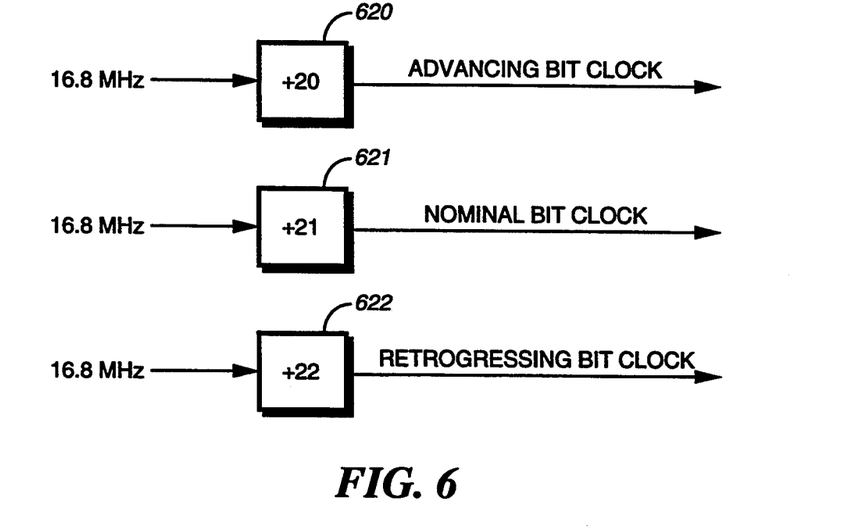
FIG. 6 is a block diagram representation of several dividers used to advance or retrogress data clocked into the D/A converter of FIG. 5.

Referring to FIG. 6, a method for advancing or retrogressing the pulse train timing is effected by modifying the divide ratio in the path of the input clock. For example, a divider 620, a divider 621, and a divider 622 provide divide by 20, 21, and 22 functions, respectively, for further providing an advancing bit clock, a nominal bit clock, and a retrogressing bit clock, respectively. Incrementing or decrementing the divisor causes the bit clock to advance or retrogress in time increments equal to the input clock period. In the instant example a variation of approximately 59.5 nanoseconds is achieved for the incoming bit clock.

Figure 7:
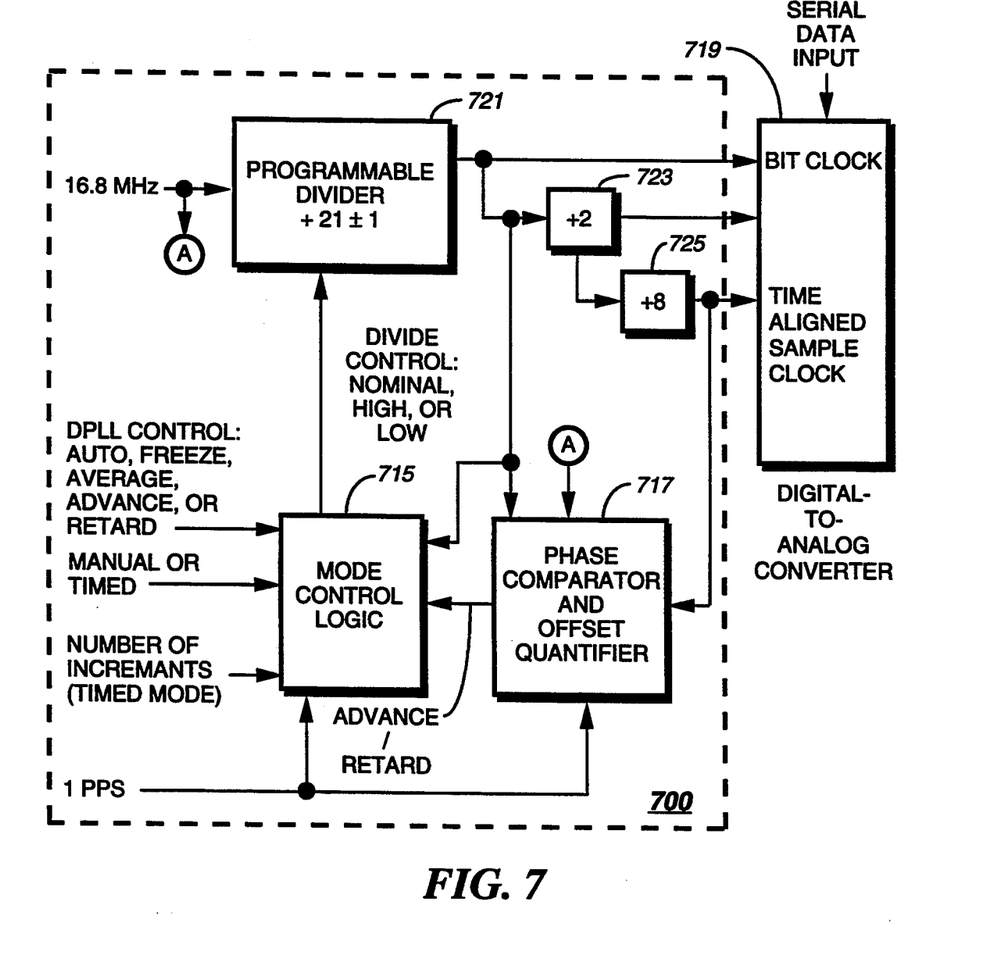
FIG. 7 is a block diagram of a Digital Phase Locked Loop (DPLL) with timing controls in accordance with the present invention.

FIG. 7 is a block diagram of a Digital Phase Lock Loop (DPLL) 700 with timing controls according to the present invention. DPLLs are commonly used in clock recovery circuits where a need exists to time-align a local clock to an incoming bit stream. Edges of the local clock are aligned to the bit stream as described by changing the divide ratio in a manner that seeks to align timing. As shown in FIG. 7, the DPLL incorporates additional operating modes for improving the timing needs in the transmitter 400 (FIG. 4). The DPLL 700 includes a programmable divider 721 for receiving the incoming clock signal (16.8 Mhertz in the present example) and having a bit clock output connected to a first input of a D/A converter 719 and further connected to an input of a divider 723. The divider 723 has a conversion clock output connected to a second input of the D/A converter 719 and to an input of a divider 725. The divider 725 provides a sample clock to a third input of the D/A converter 719.

A phase comparator and offset quantifier 717 receives at its inputs the bit clock, the incoming clock signal, the sample clock and the 1PPS signal. A mode control logic circuit 715 has inputs for receiving an advance/retard output from the phase comparator and offset quantifier 717, the bit clock signal, the 1PPS signal, and a DPLL control signal. An output of the mode control logic circuit 715, divide control, is connected to an input of the programmable divider 721. The DPLL 700 operates to align one of the rising edges of the sample clock (50 Khertz in the instant example) with a rising edge of the 1PPS signal.

For convenience, the sample clock is assumed to have a fifty percent duty cycle such that the maximum timing error occurs when the falling edge rather than the rising edge of the sample clock is time co-incident with the 1PPS signal's rising edge. In effect, the sample clock could be 180 degrees out of the desired phase. Relative to the input clock of 16.8 Mhertz, the sample clock maximum error is 336/2 periods of 16.8 Mhertz (21×2×8=336 which is the full sample clock period).

The phase comparator and offset quantifier 717 measures the number of incoming clock cycles difference from the rising edge of the 1PPS signal to the rising edge of the sample clock. Based upon this measurement, the phase comparator and offset quantifier 717 outputs the advance/retard signal which indicates the sign and magnitude of the offset by asserting the advance/retard signal for a time duration proportional to the number of incoming clock cycles times the bit clock period. If the number of 16.8 Mhertz cycles between the rising edges is between 0 and 167, then the sample clock can be advanced for fastest alignment. On the other hand, if the number of cycles is between 168 and 336, then the sample clock can be retarded for fastest alignment. For example, if the sample clock is effectively 180 degrees out of phase, the phase comparator and offset quantifier 717 would measure a timing error of 168 periods and cause a retard signal for 168 periods of 800 Khertz, or for 210 microseconds. The mode control logic circuit 715 outputs the proper divide control signal to the programmable divider 721 according to the advance/retard signal. For timing advance, the divide control is set to "low" (divide by 20) and for timing retard, the divide control is set to "high" (divide by 22).

The mode control logic circuit 715 can also be selectively enabled to provide one of a plurality of operating modes for determining how the divide control is toggled. When an auto mode is selected, the divide control ("high" or "low") is asserted for the duration that the phase comparator and offset quantifier 717 asserts the advance/retard output. Thus, one 59.5 nanosecond timing correction is made per bit clock period (approximately 5 percent change per bit clock period) to ensure no bits are lost. Given a 180 degree timing mis-alignment, the divide control is set "high" for 168 periods of 800 kilohertz, and the transmitter bit clock retards by 59.5 nanoseconds 168 times over a time span of approximately 210 microseconds. Timing correction is therefore dispersed over a multiple of bit clock periods and the D/A converter 719 continues processing incoming sample bits for conversion to analog outputs without losing data.

Having derived the sample clock from the bit clock, the sample clock retrogresses by one half of its period after the bit clock transitions propagate through the dividers 521, 523, and 525 (FIG. 5). Total sample clock retrogression occurs in no more than one period of the sample clock after the last bit clock timing adjustment. The sample clock is now aligned with the time-mark. Automatic tracking and slewing of the transmitter timing on a time-mark by time-mark basis has been described. This is accomplished as a background activity without loss or corruption of transmitter timing and digital-to-analog functions.

An average mode of operation is also selectable, wherein the divide control signal is toggled as required, but only for one bit clock period. Thus, for each 1PPS time-mark, the sample clock phase (via the bit clock) is adjusted one 59.5 nanosecond step (approximately 0.3 percent of its period), regardless of the phase difference between the sample clock and the time-mark. In effect, the transmitter timing will track the average time position of the incoming 1PPS signal. This is useful in minimizing the effect of a 1PPS time-mark having large variations in time-of-arrival.

Simulcast transmission systems using a transmitter clock operating in a free-running mode and having input commands to advance or retard the timing have available a freeze, manual advance and manual retard mode. Normal operation is in the freeze mode wherein the transmitter timing freewheels. Manual advance or manual retard may be exercised by a controller (not shown), for example, a microprocessor, for the number of bit clock periods equal to the number of 59.5 nanosecond increments that the transmitter timing is to be adjusted.

In the preferred embodiment of the present invention, a portion of the controller function relating to the manual advance and manual retard mode is implemented in the mode control logic circuit 715. Manual adjustment requires the controller to exercise the input for a duration in bit clock periods equal to the number of timing increment adjustments that the timing is to be adjusted. Input control accuracy is limited relative to the mode control logic circuit 715 timing. For example, if the controller inputs a manual advance for 14 timing increments, the actual adjustment might be 14 with an uncertainty of plus or minus two counts. In the preferred embodiment, a five bit input (for a maximum count of 31) determines the number of timing increments that are to be made.

The accuracy of the actual adjustment depends predominantly upon the phase of all clock signals at the time the input is received at the mode control logic circuit 715. In a timed advance or timed retard mode, the controller inputs the number of timing increments that are to be made as well as the appropriate sign (advance or retard). When the mode control logic circuit 715 receives an input for initiating the adjustment, the adjustment is subsequently made for the specified number of timing increments. Precise control over the exact integer timing is thus provided in the timed mode and is useful in a variety of systems.

From the foregoing discussion, it can be appreciated that the several operating modes of the preferred embodiment of the present invention enable a remote site transmitter timing to: (1) automatically track incoming time-mark pulses; (2) average incoming time-mark pulses to remove random large time-mark errors and to reduce jitter errors; (3) digitally adjust the timing by manual advance/retard modes; and (4) digitally adjust the timing by timed advance/retard modes. The remote site transmitter is able to free wheel, or continue without change, in between timing adjustments. Therefore, by using automatic, averaging, or advance/retard modes of the DPPL 700, the pulse trains which control the transmitter modulation timing can be aligned to a time-mark pulse.

A delayed 1PPS signal having a programmable delay may be used in conjunction with the DPLL 700 for providing both coarse and fine timing adjustments. When the sample clock is input into the D/A converter 719, the sample clock period determines the available timing resolution. In the alternative, clocking a direct digital synthesizer controls the phase of the output, which is directly related to the modulation timing. The 20 microsecond period of a 50 Khertz sample clock is a relatively coarse timing increment if a timing alignment of one to five microseconds is the goal. As a coarse timing adjustment, the selection of which sample clock transition represents a given analog output level places the modulation timing in 20 microsecond increments. Cable propagation delays, however, are unique to each remote site transmitter in a simulcast transmission system, and these delays alone cause variations in timing exceeding one to five microseconds. The cable length between the GPS antenna and the GPS receiver as well as the cable length between a transmitter and its respective antenna will vary significantly from transmitter to transmitter. Additional delay variations may be introduced at each remote site transmitter between the modulated Voltage Controlled Oscillator (VCO) and the antenna output. Hence, a finer adjustment in timing resolution relative to the sample clock period is needed, the resolution being fine enough such that the timing of overlapping simulcast transmitters to less than or equal to the timing alignment goal can be achieved.

Timing alignment can be accomplished by aligning all transmitters to a universal view of time such as UTC, or by aligning all transmitters to each other without regard to UTC by accounting for the difference between the transmitter having the maximum site and equipment dependent delay compared to the transmitter having the minimum site and equipment dependent delay. In the UTC case, a timing adjustment of at least the maximum delay variation expected for the timing alignment to UTC must be available. When aligning time without regard to UTC, the difference between the maximum and minimum delays between transmitters must be available to be able to time align the modulation. Overall, the general need is to effectively advance a transmitter's timing internally by an amount equal to the delays which are to be accounted for.

Some time-mark receivers have the ability to offset the time-mark output to a resolution which is small compared to the modulation timing alignment goal. Timing resolution in such time-mark receivers typically can range from one nanosecond to one microsecond. However, fine timing adjustment in the transmitter is desirable so that timing alignment operation is not uniquely dependent upon the particular time-mark receiver which is used. Based upon a reference clock of 16.8 Mhertz, a timing adjustment increment of 59.5 nanoseconds can be obtained. This timing resolution is fine enough relative to the timing goal to serve as a fine timing adjustment. The overall timing alignment can be achieved by a fine timing adjustment in conjunction with the selection of the sample clock transition correspondence to a given analog output level. The minimum total range of fine tuning adjustment need only be equal to the period of the sample clock to allow total control in timing alignment.

As an example, assuming that the modulation deviation corresponding to an output from the D/A converter 719 having a magnitude equal to A is the level expected to be radiating from the antenna 212 at a time corresponding to the 47,000th sample after the eleventh second past two o'clock. Further assume that the delays in the transmitter cabling and internal filtering correspond to 512.345 microseconds. This delay corresponds to 8,607.39 periods of a 16.8 Mhertz reference clock. The closest integer is 8,607 which is approximately 512.32 microseconds. The delay can thus be split into two timing components including a coarse timing component of 25 periods of the 50 Khertz sample clock (25×20 microseconds=500 microseconds) and a fine tuning component of 207 periods (207×59.5 nanoseconds=12.32 microseconds). If the output level A was processed internally at an apparent time corresponding to the 46,974th sample (47,000−26) after the eleventh second past two o'clock, the modulation timing would be leading the desired timing by 7.68 microseconds (520−512.32). Since there are 336 reference clock periods per sample clock period, the 7.68 microseconds corresponds to 129 periods of the reference clock (336−207). Processing the output level A at the apparent 46,974th sample plus an internal delay of 7.68 microseconds will effectively advance the transmitter timing by the desired 512.32 microseconds (520−7.68).

From the foregoing example, it can be appreciated that by a combination of advancing (or retarding) the sample processing by an integer count as a coarse timing adjustment plus an internal timing delay in increments of a higher frequency reference clock period (higher in frequency than the sample clock) for a fine timing adjustment, transmitter timing can be aligned to within the fine timing resolution. The minimum range for the fine delay adjustment needs to be the sample clock period for total freedom in timing positioning to within the fine timing resolution (assuming the transmitter receive the data in ample time to process for further transmission). In the preferred embodiment, a total delay of 975.24 microseconds in 59.5 nanosecond steps was chosen to allow operation in the case of simple delay equalization of all transmitters. The large adjustment range eliminates a need to compute the offset integer sample clock count advancement number.

Figure 8:
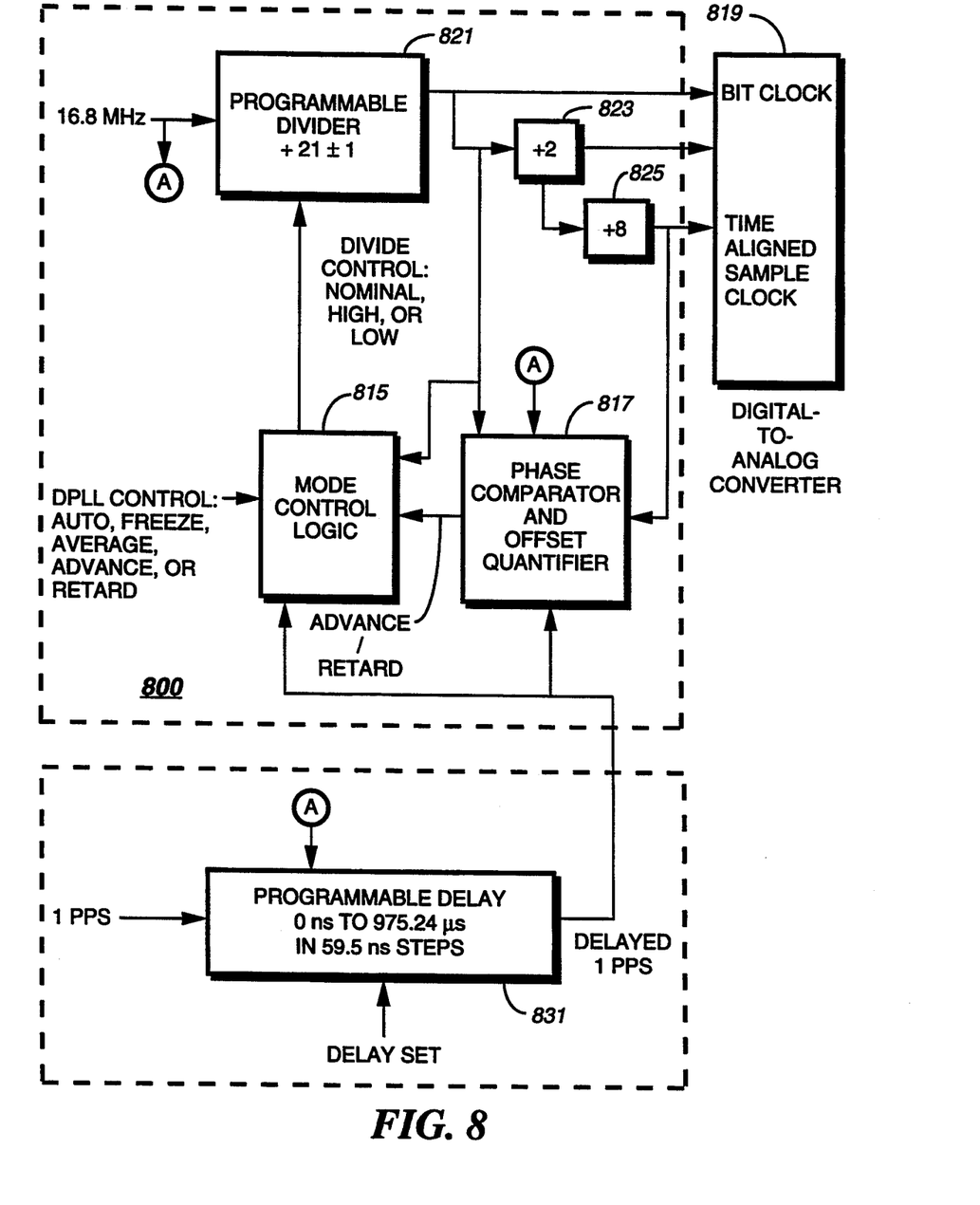
FIG. 8 is a block diagram of a DPLL with timing controls and having a delayed 1PPS (one pulse per second) programmable delay.

FIG. 8 depicts a block diagram of a DPLL 800 with a delayed 1PPS programmable delay 831. The DPLL 800 is similar to the DPLL 700 shown in FIG. 7 except that the timed inputs of the DPLL 700 are not included in the DPLL 800. The programable delay 831 receives the incoming clock, the 1PPS signal and a delay set signal at its inputs, and outputs a delayed 1PPS signal. The delayed 1PPS signal is input to a phase comparator and offset quantifier 817 and a mode control logic circuit 815.

Figure 9:
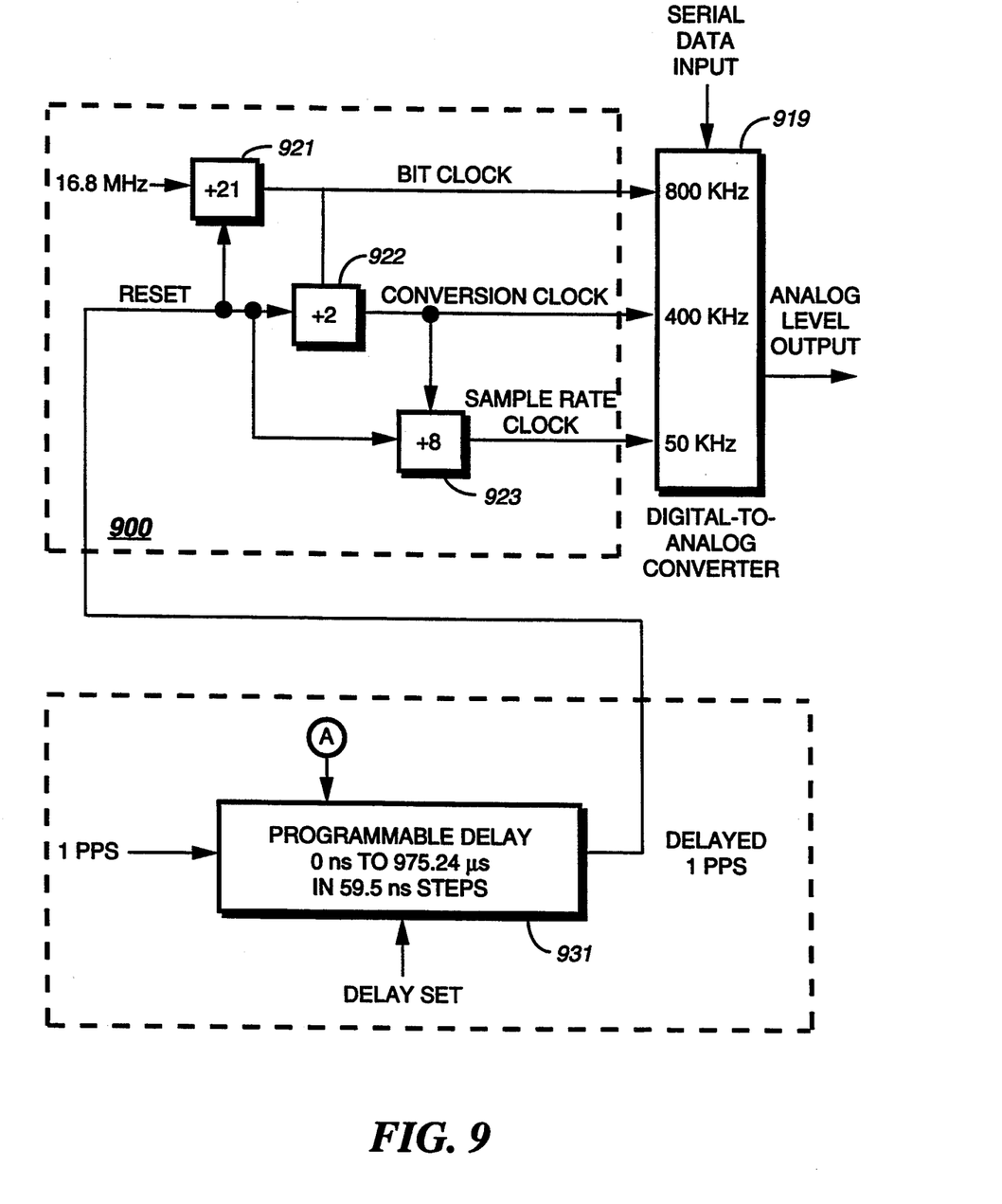
FIG. 9 is a block diagram of a time synchronized pulse train generator having a delayed 1PPS programmable delay as an alternative embodiment of the system of FIG. 8.

FIG. 9 illustrates an alternative embodiment wherein a delayed 1PPS programmable delay circuit 931 has a delayed 1PPS output signal connected to an input of each divider 921, 922, and 923 of a time synchronized pulse train generator 900.

Not only may large random errors in timing pulse output appear, but time-mark receiver failure may result from permanent timing offset bias beyond the timing accuracy requirement of the system. Hence, there is a need for the transmitter timing to reject timing pulses that are beyond the typical timing error performance of the time-mark receiver and likely beyond the system timing accuracy requirement. There also exists a need for the transmitter timing to provide a means for detecting permanent timing offset bias in the time-mark input to the transmitter. As described, the transmitter clock has a freewheeling capability that can be used for determining the validity of a timing pulse input. The validity of the incoming time-mark pulse can be verified based on the expected time-of-arrival for the pulse based on the transmitter's freewheeling clock. If the time-mark pulse is received outside the timing accuracy tolerance, the pulse may be blocked and a logical signal can be generated to indicate an invalid pulse.

As an example, assume that the time-mark accuracy is plus or minus one microsecond. If one time-mark leads UTC by one microsecond and a subsequent time-mark lags UTC by one microsecond, a total time difference from an exact one second interval is two microseconds. Given a transmitter clock accuracy of plus or minus 1 ppb, in one second a time error of one nanosecond will be accrued. The one nanosecond is small compared to the time-mark variation. Therefore, the transmitter clock can be used to measure the time-of-arrival compared to the previous time-mark. The closest integer increment to two microseconds in 16.8 Mhertz periods is 34 (34×59.5 nanoseconds=2.02 microseconds). A valid time-of-arrival can be judged against the transmitter's clock by testing with an anticipated window of plus or minus 34 periods of 16.8 million cycles of the transmitter's clock from the previous time-mark.

Figure 10:
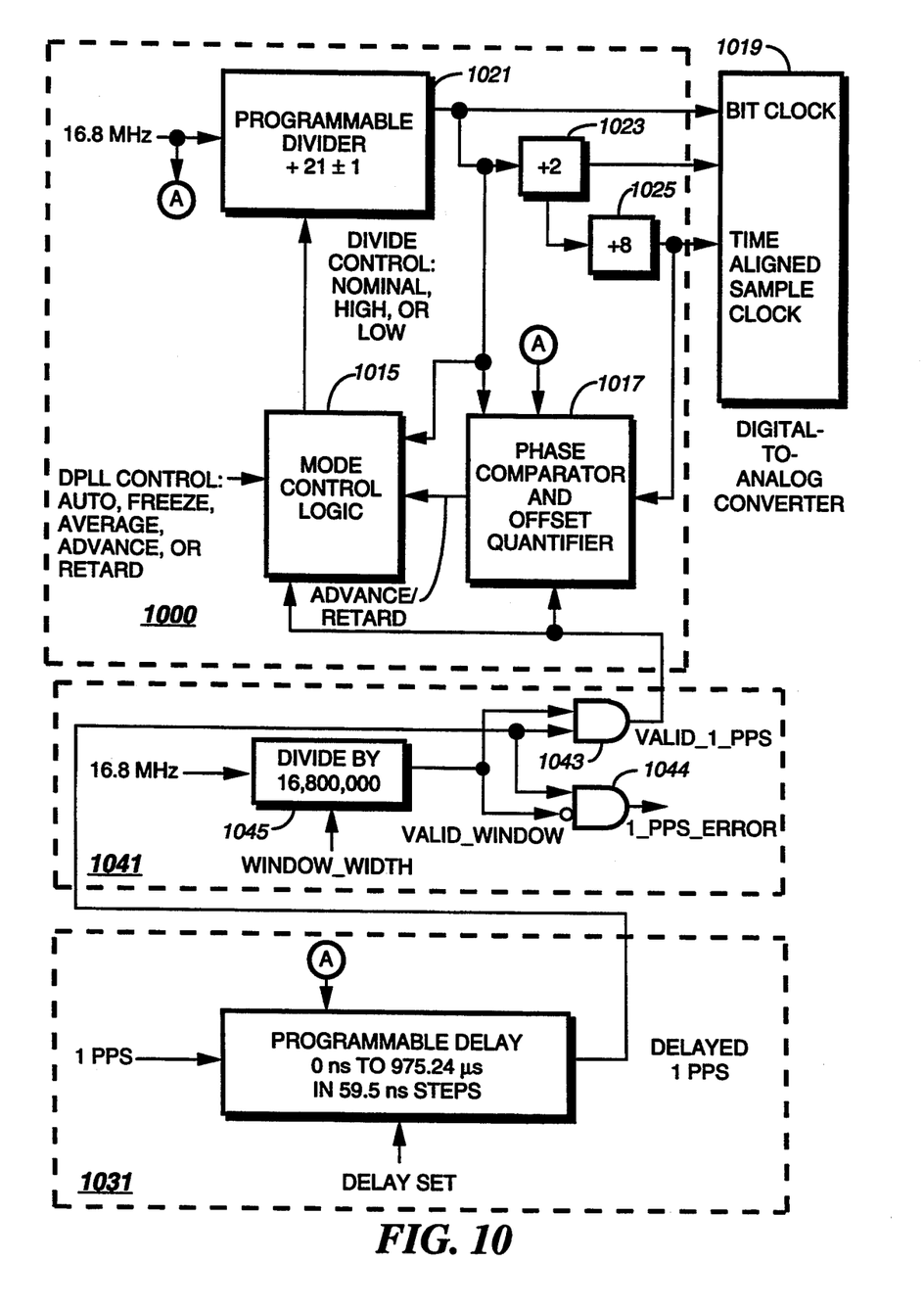
FIG. 10 is a block diagram of a DPLL with timing controls and having a delayed 1PPS (one pulse per second) programmable delay with 1PPS validated windowing.

FIG. 10 is a block diagram of a DPLL 1000 with timing controls using a delayed 1PPS with programmable delay circuit 1031 and a 1PPS validated windowing circuit 1041 for determining whether a time-mark pulse is received within a predetermined window. The DPLL 1000 and the delayed 1PPS with programmable delay circuit 1031 are similar to the DPLL 800 and the delayed 1PPS with programmable delay 831 as shown in FIG. 8 with the exception that the 1PPS validated windowing circuit 1041 is coupled therebetween such that a valid 1PPS signal is output from the 1PPS validated windowing circuit 1041 and is connected to inputs of a phase comparator and offset quantifier 1017 and a mode logic control circuit 1015.

The 1PPS validated windowing circuit 1041 includes a divider 1045 which receives a window width input and divides the 16.8 Mhertz reference clock by 16,800,000. A valid window output signal of the divider 1045 is input into an And gate 1043 and an And gate 1044. The And gates 1043 and 1044 are enabled by a delayed 1PPS signal form the delayed 1PPS with programmable delay circuit 1031.

The window width may be considered as a plus/minus number of cycles centered about a division by 16.8 million for producing a valid window output from the And gate 1043. The valid window output enables the And gate 1043 to pass the incoming 1PPS signal as a valid 1PPS. If the 1PPS signal arrives outside the expected window, a 1PPS error signal is output by the And gate 1044. In the given example, a window of approximately plus or minus 0.5 microseconds, plus or minus 1 microsecond, plus or minus 2 microseconds, or plus or minus 4 microseconds can be chosen as a window width. The window width chosen is a matter of the system accuracy requirements. The 1PPS error signal can be monitored by a processor for making a decision regarding the accuracy of the incoming 1PPS signal. A time-mark that starts to arrive at a substantial offset from the correctly aligned time position will cause repeated 1PPS error signals. Repeated 1PPS error signals indicates a non-random timing failure. Alternative system recovery methods would then be initiated.

Figure 11:
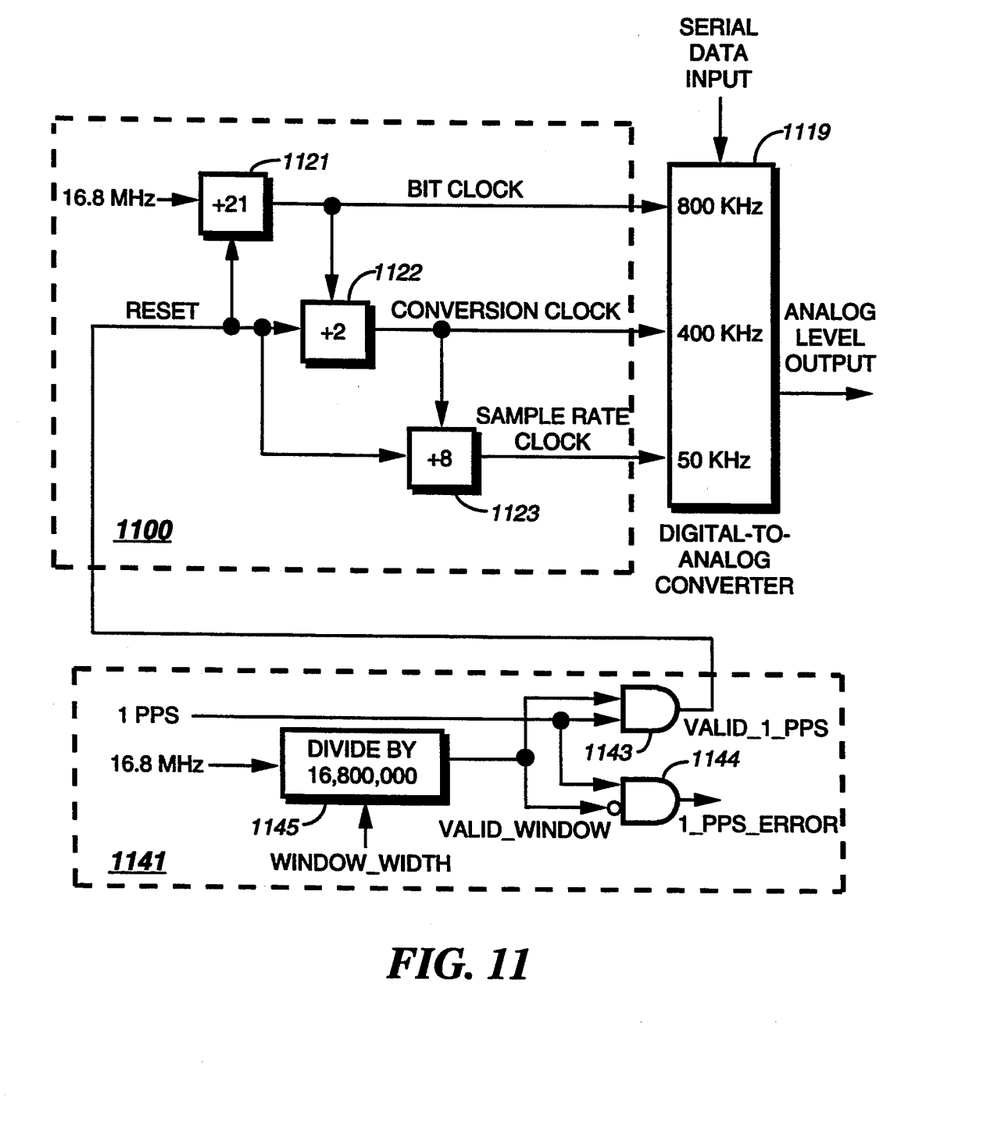
FIG. 11 is a block diagram of a time synchronized pulse train generator having a delayed 1PPS programmable delay as an alternative embodiment of the system of FIG. 10.

FIG. 11 shows an alternative embodiment wherein a time synchronized pulse train generator 1100 is connected to a 1PPS validated windowing circuit 1141 for receiving the valid 1PPS signal therefrom.

Although the present invention has been described in relation to particular embodiments thereof, many other variations and modifications and other uses will become apparent to those skilled in the art. Therefore, the present invention is limited only by the claims.

We claim:

1. A phase lock loop for making phase corrections on a sample clock signal based on a precision timing signal, the phase corrections being dispersed over time, said phase lock loop comprising:
a first divider circuit having a divisor n, coupled to the precision timing signal for dividing the precision timing signal by n to produce a bit clock signal wherein the divisor n can be selectively incremented or decremented to divide the precision timing signal by n, by n+1, or by n−1;
a second divider circuit coupled to the bit clock signal for dividing the bit clock signal to produce the sample clock signal;
a phase comparator coupled to a time-mark signal and coupled to the sample clock signal for comparing said time-mark signal and said sample clock signal to generate a correction signal indicating a direction of a phase error, the correction signal having a duration proportional to a number of cycles of the precision timing signal from a predetermined edge of the time-mark signal to a predetermined edge of the sample clock signal for further indicating a magnitude said phase error between the sample clock signal and the time-mark signal, the correction signal utilized by a mode control circuit for determining a divide control signal for selectively incrementing or decrementing the divisor n for correcting said phase error; and
the mode control circuit coupled to the time-mark signal and coupled to the phase comparator for receiving the correction signal, and further coupled to the first divider circuit for receiving the bit clock signal and for sending to the first divider circuit the divide control signal.

2. The phase lock loop according to claim 1 wherein a mode control signal is coupled to the mode control circuit for selecting one of a plurality of phase lock loop operating modes, a first operating mode including an auto mode wherein the divide control signal is applied for a time substantially equal to the duration of the correction signal.

3. The phase lock loop according to claim 2 wherein a second operating mode of said phase lock loop includes an average mode, wherein the average mode causes the mode control circuit to operate such that the divide control signal is toggled for only one cycle of the precision timing signal for each cycle of the time-mark signal.

4. The phase lock loop according to claim 3 further comprising a controller coupled to said mode control circuit, wherein a third operating mode of said phase lock loop includes a timed mode such that the controller can input into said mode control circuit a value indicative of a number of cycles of the bit clock signal and a direction either to advance or to retard the phase of the sample clock signal said mode control circuit in response asserting the divide control signal for a duration equal to said number of cycles of the bit clock signal to advance or retard the phase of the sample clock signal accordingly.

5. The phase lock loop according to claim 1 further comprising a digital to analog converter coupled to the first and second divider circuits for receiving data in a digital format, wherein the data is clocked therein under control of the bit clock signal, and an analog output level corresponding to the clocked data is clocked out under control of the sample clock signal.

6. The phase lock loop according to claim 1 further comprising a time-mark programmable delay circuit coupled to the time-mark signal for delaying the time-mark signal, and coupled to said phase comparator and said mode control circuit for applying a delayed time-mark signal to said phase comparator and said mode control circuit, said time-mark programmable delay circuit having a delay set signal applied thereto for determining an amount of delay to be applied to the time-mark signal.

7. The phase lock loop according to claim 6 further comprising a time-mark validated windowing circuit coupled between the time-mark programmable delay circuit and said phase comparator and said mode control circuit, said time-mark validated windowing circuit providing a valid time-mark signal to said phase comparator and said mode control circuit for indicating whether a time-mark arrives at said time-mark validated windowing circuit within a predetermined timing window.

8. A digital phase lock loop for making both coarse and fine resolution phase corrections between an incoming clock signal and a sample clock signal, the phase corrections being dispersed over time, said digital phase lock loop comprising:
a programmable divider circuit having a divisor n that is selectively incrementable or decrementable, coupled to the incoming clock signal for dividing the incoming clock signal and generating a bit clock signal therefrom;
a divider circuit coupled to the bit clock signal for dividing the bit clock signal and generating the sample clock signal therefrom;
a phase comparator coupled to the incoming clock signal, the bit clock signal, and the sample clock signal, for measuring a number of the incoming clock signal cycles from a predetermined edge of a time-mark signal when a valid time-mark signal is received, to a predetermined edge of the sample clock signal and for providing a correction signal indicative of a direction and magnitude of a phase error between the sample clock signal and the time-mark signal, the correction signal having a duration proportional to the number of incoming clock signal cycles measured;
a mode control circuit coupled to a time-mark validated windowing circuit for receiving the valid time-mark signal, said mode control circuit also coupled to the phase comparator for receiving the correction signal and coupled to the programmable divider circuit for receiving the bit clock signal for generating a divide control signal therefrom to control said programmable divider circuit for incrementing or decrementing the divisor n according to the correction signal when the valid time-mark signal is received;
the time-mark validated windowing circuit coupled to a programmable delay circuit for receiving therefrom a delayed time-mark signal for determining whether the time-mark signal has been received by the time-mark validated windowing circuit within a predetermined time window, and for generating the valid time-mark signal, when the time-mark signal has been received with the predetermined time window and further coupled to the mode control circuit and to the phase comparator for sending the valid time-mark signal thereto; and the programmable delay circuit coupled to the time-mark signal and to a delay set signal for receiving the time-mark signal and the delay set signal for fine tuning the time-mark signal said programmable delay circuit providing the delayed time-mark signal therefrom.

9. The digital phase lock loop according to claim 8 wherein said programmable divider is selectively incremented or decremented by the divide control signal for dividing the incoming clock signal by n, n+1, or n−1.

10. The digital phase lock loop according to claim 9 wherein a mode control signal is coupled to the mode control circuit for selecting one of a plurality Of phase lock loop operating modes, a first operating mode of said plurality of operating modes including an auto mode wherein the divide control signal is active for a time substantially equal to the duration of the correction signal.

11. The digital phase lock loop according to claim 10 wherein a second operating mode of said plurality of operating modes includes an average mode, wherein the mode control circuit may be selected such that the divide control signal is active for only one cycle of the incoming clock signal for each cycle of the time-mark signal.

12. The digital phase lock loop according to claim 11 further comprising a controller coupled to said mode control circuit, wherein a third operating mode of said plurality of operating modes includes a timed mode such that the controller can input into said mode control circuit a value indicative of a number of cycles of the bit clock signal and a direction either to advance or to retard the phase of the sample clock signal and wherein in response said mode control circuit asserts the divide control signal for a duration equal to said number of cycles of the bit clock signal to advance or retard the phase of the sample clock signal accordingly.

13. A remote site transmitter for use in a simulcast transmission system, said remote site transmitter receiving a message bundle from a central controller via an interconnect link, the message bundle including a digital message portion and a launch time, said remote site transmitter converting the digital message portion into an analog message and retransmitting the analog message to a given geographical area at a time determined, at least in part, by the launch time, said remote site transmitter comprising:

a processor for separating the message bundle into the digital message portion and the launch time, the processor including a phase comparator;

a receiver for receiving a timing reference signal and generating therefrom a time-mark signal for delivery to the processor;

a digital to analog converter coupled to the processor for receiving the digital message portion and reconstructing the analog message; and a transmitter coupled to the digital to analog converter for receiving the analog message and retransmitting the analog message to the given geographical area; and a clock generator coupled to said phase comparator for making phase corrections on a sample clock signal based on a precision timing signal, the phase corrections being dispersed over time, said clock generator comprising:

a first divider circuit having a divisor n, coupled to the precision timing signal for dividing the precision timing signal by n to produce a bit clock signal, and coupled to the digital to analog converter and to the processor for providing the bit clock signal thereto;

a second divider circuit coupled to the bit clock signal for dividing the bit clock signal to produce the sample clock signal, and coupled to the digital to analog converter and to the processor for providing the sample clock signal thereto;

the phase comparator coupled to the time-mark signal and coupled to the sample clock signal for comparing said time-mark signal and said sample clock signal to generate a correction signal indicating a direction of a phase error, the correction signal having a duration proportional to a number of cycles of the precision timing signal from a predetermined edge of the time-mark signal to a predetermined edge of the sample clock signal for further indicating a magnitude of said phase error between the sample clock signal and the time-mark signal, the correction signal utilized for determining a divide control signal for selectively incrementing or decrementing the divisor n for correcting said phase error simultaneously with the processing of the message bundle.

14. The remote site transmitter according to claim 13 wherein the divisor n can be selectively incremented or decremented to divide the precision timing signal by n, by n+1, or by n−1.

15. The remote site transmitter according to claim 14 further comprising a mode control circuit coupled to the time-mark-signal and coupled to the phase-comparator for receiving the correction signal, and further coupled to the first divider circuit for receiving the bit clock signal, and for generating a divide control signal for selectively incrementing or decrementing the divisor n.

16. The remote site transmitter according to claim 15 wherein a mode control signal is coupled to the mode control circuit for selecting one of a plurality of phase lock loop operating modes, a first operating mode including an auto mode wherein the divide control signal is applied for a time substantially equal to the duration of the correction signal.

17. The remote site transmitter according to claim 16 wherein a second operating mode of said phase lock loop includes an average mode wherein the average mode causes the mode control circuit to operate such that the divide control signal is toggled for only one cycle of the precision timing signal for each cycle of the time-mark signal.

18. The remote site transmitter according to claim 17 further comprising a controller coupled to said mode control circuit, wherein a third operating mode of said phase lock loop includes a timed mode such that the controller can input into said mode control circuit a value indicative of a number of cycles of the bit clock signal and a direction either to advance or to retard the phase of the sample clock signal said mode control circuit in response asserting the divide control signal for a duration equal to said number of cycles of the bit clock signal to advance or retard the phase of the sample clock signal accordingly.

19. The remote site transmitter according to claim 13 wherein the digital to analog converter is coupled to the first and second divider circuits for receiving data in a digital format, and wherein the data is clocked therein under control of the bit clock signal, and wherein an analog output level corresponding to the clocked data is clocked out under control of the sample clock signal.

20. The remote site transmitter according to claim 15 further comprising a time-mark programmable delay circuit coupled to the time-mark signal for delaying the time-mark signal, and coupled to said phase comparator and said mode control circuit for applying a delayed time-mark signal to said phase comparator and said mode control circuit, said time-mark programmable delay circuit having a delay set signal applied thereto for determining an amount of delay to be applied to the time-mark signal.

21. The remote site transmitter according to claim 20 further comprising a time-mark validated windowing circuit coupled between the time-mark programmable delay circuit and said phase comparator and said mode control circuit, said time-mark validated windowing circuit providing a valid time-mark signal to said phase comparator and said mode control circuit for indicating whether a time-mark arrives at said time-mark validated windowing circuit within a predetermined timing window.

* * * * *